US006809014B2

(12) United States Patent
Mathew et al.

(10) Patent No.: US 6,809,014 B2
(45) Date of Patent: Oct. 26, 2004

(54) METHOD TO FABRICATE SURFACE P-CHANNEL CMOS

(75) Inventors: Suraj J. Mathew, Boise, ID (US); Jigish D. Trivedi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 12 days.

(21) Appl. No.: 09/808,261

(22) Filed: Mar. 14, 2001

(65) Prior Publication Data

US 2002/0132412 A1 Sep. 19, 2002

(51) Int. Cl.[7] .................. H01L 21/425; H01L 21/8238
(52) U.S. Cl. .................. 438/514; 438/199; 438/219
(58) Field of Search .................. 438/514, 199, 438/229

(56) References Cited

U.S. PATENT DOCUMENTS 5,455,437 A * 10/1995 Komori et al. ............. 257/376
5,750,424 A * 5/1998 Choi et al. ................. 438/199
6,110,788 A    8/2000 Violette et al. ............. 438/301
6,323,103 B1 * 11/2001 Rengarajan et al. ........ 438/424

* cited by examiner

Primary Examiner—Alexander Ghyka
(74) Attorney, Agent, or Firm—Schwegman, Lundberg, Woessner & Kluth, P.A.

(57) ABSTRACT

An improved method of making CMOS surface channel transistors using fewer masking steps. In-situ doped poly silicon deposition can be used to reduce problems with poly depletion effects in transistor gates. In addition, using this method, the number of layers in each gate dielectric, the dielectric type, and dielectric thickness between n-channel and p-channel devices can be separately controlled. This method also allows the use of a lithography mask normally used to fabricate buried channel devices for use in fabricating surface channel devices, thus saving the manufacture of an additional mask.

24 Claims, 7 Drawing Sheets

METHOD TO FABRICATE SURFACE P-CHANNEL CMOS

FIELD OF THE INVENTION

The invention relates to the fabrication of semiconductor devices, such as dynamic random access memory devices, and more particularly to patterning and fabrication surface p-channel transistor devices.

BACKGROUND OF THE INVENTION

Complementary metal-oxide-semiconductor (CMOS) technology is widely used in integrated circuits (ICs) due to the lower power consumption as compared to previously preferred NMOS or Bipolar IC's. CMOS is so named because it uses both p-and n-channel transistors in its ICs. However, fabricating both p-channel and n-channel transistors on the same IC adds a number of processing steps to the IC fabrication process.

The n-channel devices typically require n+ poly silicon gate material to set the correct turn-on voltage (threshold). The p-channel devices can be either a buried channel or surface channel device depending on whether n+ or p+ poly silicon is used for the gate material. When a p-channel transistor uses the same n+ poly silicon material as the NMOS device, then it is considered to be a buried p-channel device and the subsequent fabrication process becomes cost-effective. As a result, buried p-channel devices were predominantly used in DRAM and SRAM technologies. The disadvantage of buried p-channel devices is that they are slow (lower current drive) and have non-scalable threshold voltages. DRAM's, till recently, decided to stay with the buried p-channel transistors since it kept the rest of the processing in the array and peripheral n-channel transistors simpler. On the other hand, to achieve higher speed and voltage scalability the SRAM's elected to switch to surface p-channel devices. CMOS with surface p-channel transistors, however, needed a hardened gate oxide and two separate formations of gate poly silicon (n+ and p+) resulting in an extra masking step. With the addition of across the die hardened gate oxide, this surface p-channel CMOS design had to settle for slightly degraded n-channel transistors, because only one gate oxide deposition step was practical.

A prior fabrication method used in forming a pair of complementary surface channel CMOS transistors is as follows. First a P-well and an N-well is created in the substrate, then a gate oxide is formed over the complementary wells. To form the gates, an intrinsic poly silicon layer is deposited over the gate oxide. Then, a gate region for the p-channel device is masked over the N-well and the intrinsic poly silicon layer in the p-channel gate region is doped to P-type poly silicon. After doping the p-channel gate region, the mask is removed, and a gate region for the n-channel device is masked over the P-well and the intrinsic poly silicon layer in the n-channel gate region is doped to N-type poly silicon.

One drawback with this method of IC manufacture is that it requires several lithography masking steps. The substrate must be masked while forming the P-well. The substrate must be masked again when forming the N-well. Another masking step is needed to introduce the P-type dopant for the p-channel gate, and a fourth masking step is needed to introduce the N-type dopant for the n-channel gate. Lastly, a fifth masking step is needed to pattern the final gate stack just prior to the isolation step.

In doping the poly silicon gate layer, the dopant can be diffused into the layer by exposure to a dopant atmosphere, or the dopant can be ion implanted. In either case, the concentration profile through the thickness of the doped poly silicon layer varies significantly. This concentration gradient is detrimental to device performance. Gates formed by doping poly silicon tend to form a poly depletion layer near the gate oxide during operation, which causes an increase in effective gate oxide thickness. The dopants introduced to the poly silicon layer are more heavily concentrated in the top surface of the gate region than at the bottom, adjacent the gate oxide. An increase in effective gate oxide thickness can decrease device performance. Therefore, it is preferable to have in-situ doped poly silicon over implanted poly silicon.

Another major disadvantage of this approach, as seen by DRAM's, is that one can no longer rely on conventional source-drain re-oxidation schemes to selectively increase the oxide thickness at the poly gate edges due to the presence of hardened gate oxide. The hardened gate oxide inhibits oxygen diffusion from beneath the gate, which is needed to increase the oxide thickness at the poly gate edges. The DRAM's rely on this step to lower the electric field at the gate-edge and thereby reduce the gate-induced drain leakage (GIDL) in the access transistor.

What is needed is a method of gate formation in CMOS circuits that uses fewer masking steps while still avoiding poly depletion effects. What is also needed is a method of forming gates for CMOS surface channel transistors where the gate dielectrics may be individually tailored for composition and number of layers to perform optimally with the associated gate material.

SUMMARY OF THE INVENTION

An improved method of making CMOS surface channel transistors using fewer masking steps is shown. A single mask step may be used to mask a first gate poly silicon layer. The mask may then be used to form a doped well, to optionally remove a first dielectric layer and deposit a second dielectric layer, and to deposit a second gate poly silicon layer that is complementary to the first poly silicon layer. In-situ doped poly silicon deposition may also be used in both P-type and N-type poly silicon layers to reduce problems with poly depletion effects.

Using this method, the first and second gate dielectrics thicknesses and compositions can be separately controlled and the second gate dielectric is localized to areas that specifically need it. One doped well can be implanted through the first gate dielectric, and the first gate dielectric can then be removed without concern for any damage created during the implant step. A second gate dielectric, tailored to the gate material that will be formed on top of the second gate dielectric, may then be formed with a different number of layers, a different composition, and a different thickness than the first gate dielectric if desired.

This method also allows the use of a lithography mask normally used to fabricate buried channel devices for use in fabricating surface channel devices, thus saving the manufacture of an additional mask.

Although specific embodiments have been listed, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

DETAILED DESCRIPTION OF THE PREFERRED EMBODIMENTS

Figure 1:
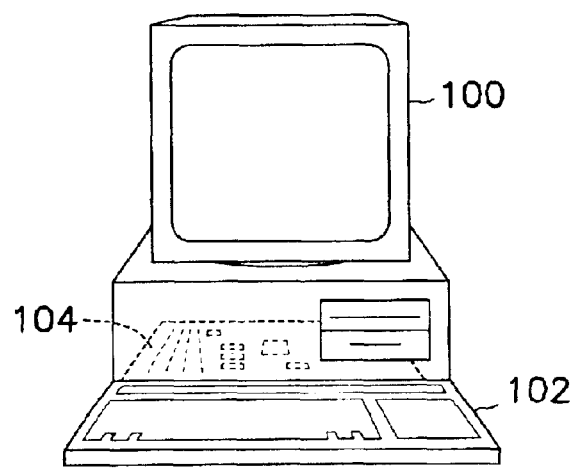
FIG. 1 shows a personal computer as one form of an information handling device.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 2:
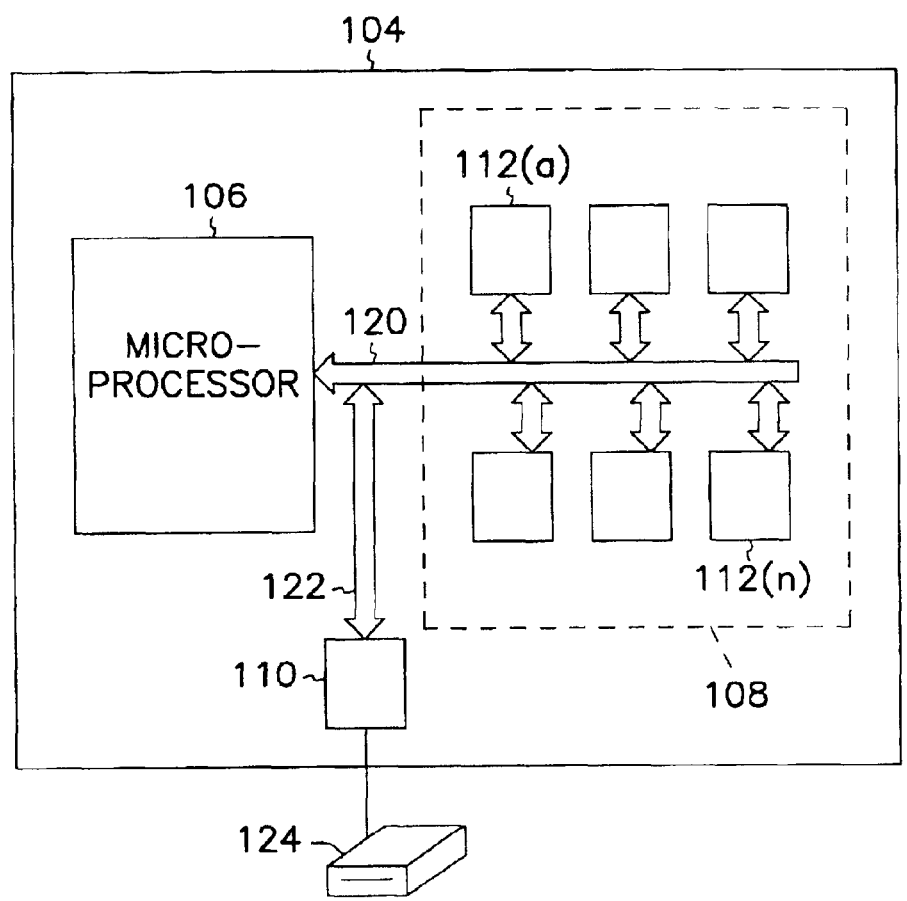
FIG. 2 shows a schematic drawing of the personal computer from FIG. 1.

A personal computer, as shown in FIGS. 1 and 2, include a monitor 100, keyboard input 102 and a central processing unit 104. The processor unit typically includes microprocessor 106, memory bus circuit 108 having a plurality of memory slots 112(a–n), and other peripheral circuitry 110. Peripheral circuitry 110 permits various peripheral devices 124 to interface processor-memory bus 120 over input/output (I/O) bus 122.

Microprocessor 106 produces control and address signals to control the exchange of data between memory bus circuit 108 and microprocessor 106 and between memory bus circuit 108 and peripheral circuitry 10. This exchange of data is accomplished over high speed memory bus 120 and over high speed I/O bus 122.

Coupled to memory bus 120 are a plurality of memory slots 112(a–n) which receive memory devices well known to those skilled in the art. For example, single in-line memory modules (SIMMs) and dual in-line memory modules (DIMMs) may be used in the implementation of the present invention. Each type of integrated memory device has an associated communications speed which in turn limits the speed data can be read out of or written into memory bus circuit 108.

These memory devices can be produced in a variety of designs which provide different methods of reading from and writing to the dynamic memory cells of memory slots 112. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 108. A typical communication speed using page mode a DRAM device is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 120. Other alternative types of devices include SDRAM, DDR SDRAM, SLDRAM and Direct RDRAM as well as others such as SRAM or Flash memories.

Figure 3:
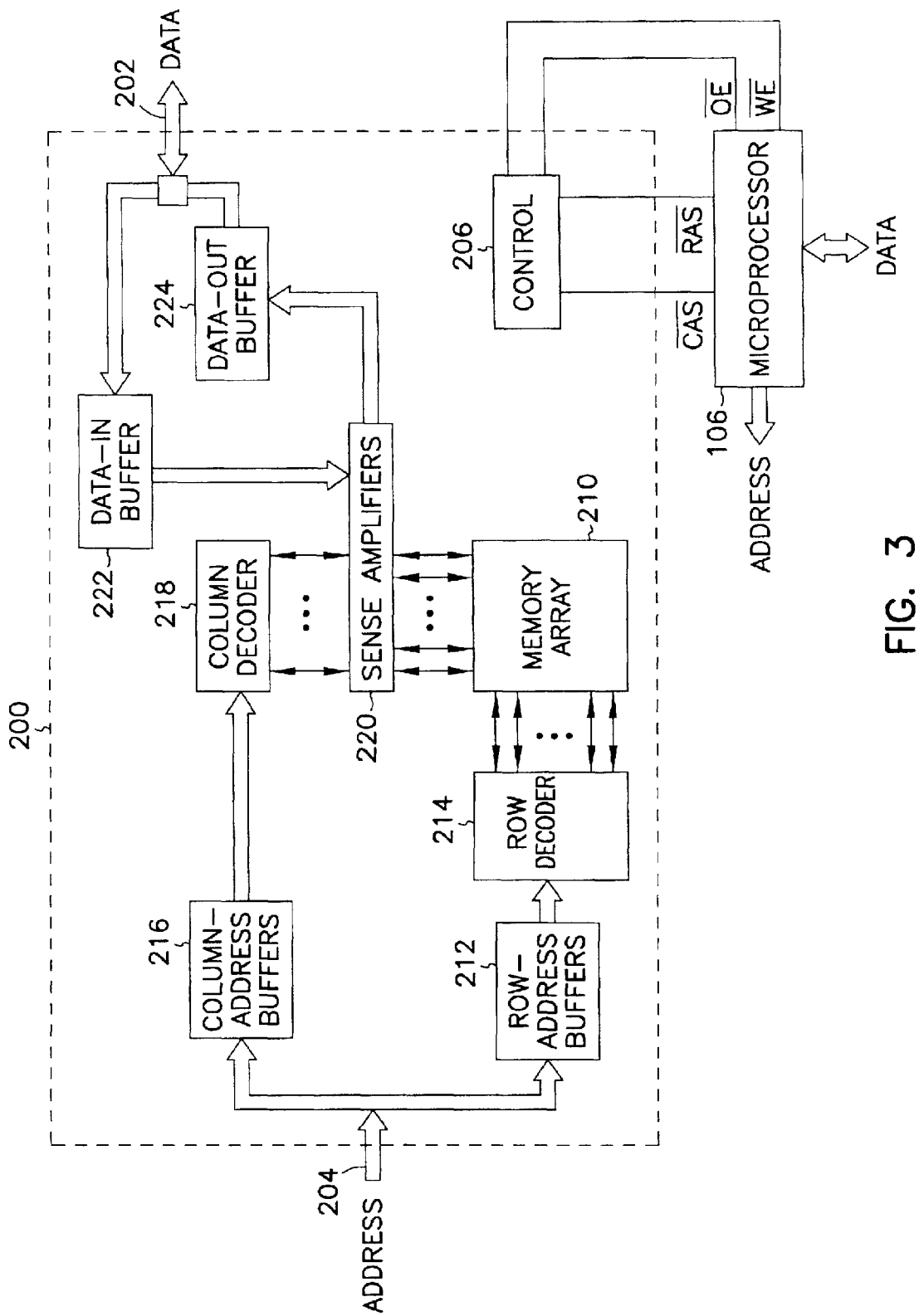
FIG. 3 shows a schematic drawing of a DRAM semiconductor memory device.

FIG. 3 is a block diagram of an illustrative DRAM device 200 compatible with memory slots 112(a–n). The description of DRAM 200 has been simplified for purposes of illustrating a DRAM memory device and is not intended to be a complete description of all the features of a DRAM. Those skilled in the art will recognize that a wide variety of memory devices may be used in the implementation of the present invention.

Control, address and data information provided over memory bus 120 is further represented by individual inputs to DRAM 200, as shown in FIG. 3. These individual representations are illustrated by data lines 202, address lines 204 and various discrete lines directed to control logic 206.

As is well known in the art, DRAM 200 includes memory array 210 which in turn comprises rows and columns of addressable memory cells. Each memory cell in a row is coupled to a common wordline. Additionally, each memory cell in a column is coupled to a common bitline. Each cell in memory array 210 includes a storage capacitor and an access transistor as is conventional in the art.

DRAM 200 interfaces with, for example, microprocessor 106 through address lines 204 and data lines 202.

Alternatively, DRAM 200 may interface with a DRAM controller, a micro-controller, a chip set or other electronic system. Microprocessor 106 also provides a number of control signals to DRAM 200, including but not limited to, row and column address strobe signals RAS* and CAS*, write enable signal WE*, an output enable signal OE* and other conventional control signals.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high. However, an asterisk (*) following the signal name in this application indicates that the signal is negative or inverse logic. Negative or inverse logic is considered active when the signal is low.

Row address buffer 212 and row decoder 214 receive and decode row addresses from row address signals provided on address lines 204 by microprocessor 106. Each unique row address corresponds to a row of cells in memory array 210. Row decoder 214 includes a wordline driver, an address decoder tree, and circuitry which translates a given row address received from row address buffers 212 and selectively activates the appropriate wordline of memory array 210 via the wordline drivers.

Column address buffer 216 and column decoder 218 receive and decode column address signals provided on address lines 204. Column decoder 218 also determines when a column is defective and the address of a replacement column. Column decoder 218 is coupled to sense amplifiers 220. Sense amplifiers 220 are coupled to complementary pairs of bitlines of memory array 210.

Sense amplifiers 220 are coupled to data-in buffer 222 and data-out buffer 224. Data-in buffers 222 and data-out buffers 224 are coupled to data lines 202. During a write operation, data lines 202 provide data to data-in buffer 222. Sense amplifier 220 receives data from data-in buffer 222 and stores the data in memory array 210 as a charge on a capacitor of a cell at an address specified on address lines 204.

During a read operation, DRAM 200 transfers data to microprocessor 106 from memory array 210. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 220 detects and amplifies a difference in voltage between the complementary bitlines. The sense amplifier passes the amplified voltage to data-out buffer 224.

Control logic 206 is used to control the many available functions of DRAM 200. In addition, various control circuits and signals not detailed herein initiate and synchronize DRAM 200 operation as known to those skilled in the art. As stated above, the description of DRAM 200 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Figure 4A:
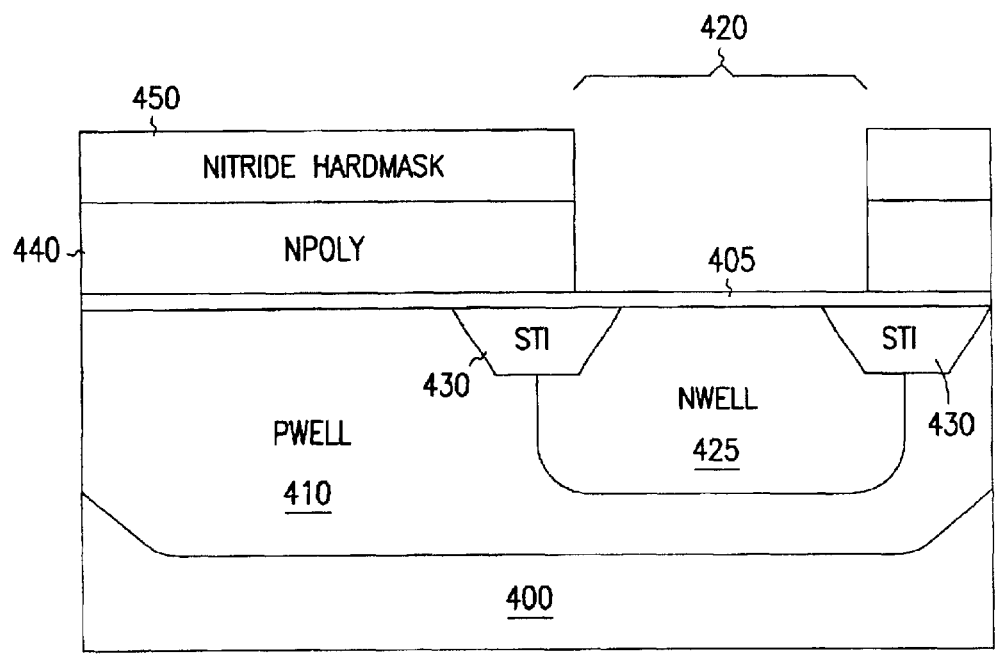
FIGS. 4a–4d show steps in the manufacture of a pair of transistors according to a first embodiment of the present invention.

FIG. 4a shows a first step in a first embodiment of the invention. A semiconductor substrate 400 such as silicon, poly silicon or intrinsic silicon is doped with a P-type dopant to form a P-well 410. Isolation structures 430 are formed within the substrate 400, and may be located within the P-well 410. The isolation structures may be formed before or after the P-well is formed. A first gate dielectric layer 405 that is compatible with an N-poly silicon gate material is grown on top of the substrate. Although this embodiment uses only one layer in the first gate dielectric layer 405, the first gate dielectric may be made up of multiple layers. An N-type poly silicon layer 440 is then deposited on top of the first gate dielectric layer 405. In this embodiment, the N-type poly silicon is deposited in-situ.

In-situ deposition includes dopant atoms along with silicon atoms at a specified concentration during deposition. The doped poly silicon is therefore grown in one simultaneous step, as opposed to depositing poly silicon in one step, and introducing a dopant species in a subsequent step. In-situ deposition of doped poly silicon results in a more uniformed concentration gradient or profile across the deposited layer. In-situ deposition of doped poly silicon is therefore effective to curb increases in effective gate dielectric thickness due to poly depletion effects.

After in-situ deposition of the N-type poly silicon layer 440, a masking layer 450 is deposited on top of the N-type poly silicon layer 440. In this embodiment, the masking layer is a nitride hardmask/CMP stop. Other masking layers could be used and not depart from the scope of the invention. A portion of the masking layer 450 is then removed in an N-well region 420 to expose a portion of the N-type semiconductor layer 440. This portion of the N-type semiconductor is removed in the N-well region 420 to expose a portion of the first gate dielectric 405.

An N-well 425 is created within the substrate 400, in the N-well region 420 using the masking layer 450. In this embodiment, the N-well is implanted through the first gate dielectric 405. In this embodiment, the N-well is also formed within the P-well region that was earlier formed, however, the P-well could be formed elsewhere without departing from the scope of the invention. The isolation structures 430 electrically separate the N-well from the P-well.

Figure 4B:
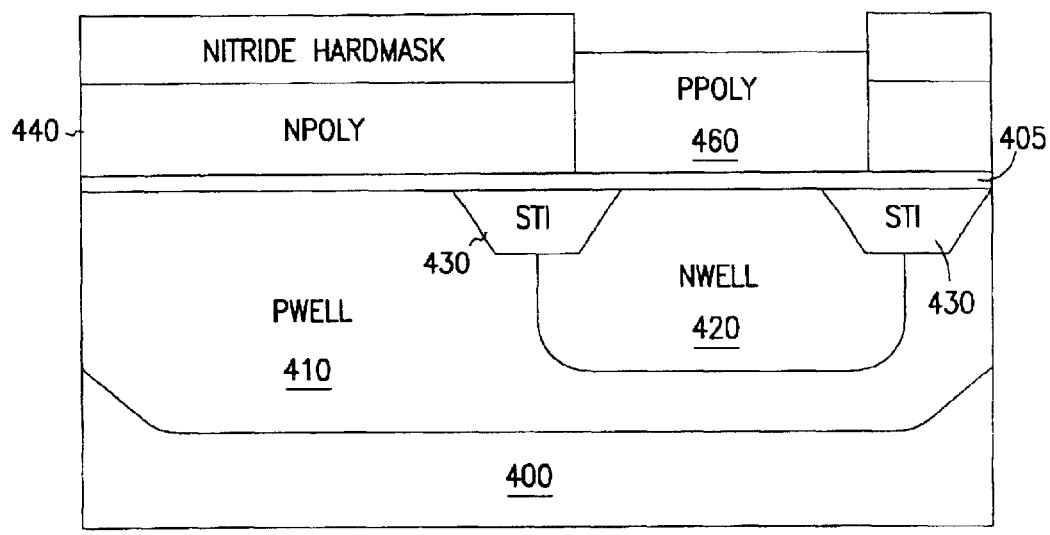

In FIG. 4b, using the same mask layer 450 that was used to create the N-well 425, a P-type poly silicon layer 460 is grown on the first gate dielectric layer 405, within the N-well region 420. Using the same mask layer is an advantage in manufacturing because it saves processing resources and materials. Not only is the material necessary to fabricate an additional mask saved, the process time needed to fabricate the semiconductor device is reduced. Alternatively, the time and processing station saved can be used to perform alternative functions in the same process time that was previously needed. In this manner, a more advanced circuit can be made instead of process time reduction.

The P-type poly silicon layer 460 is grown using in-situ deposition as described for N-type poly silicon. The doped poly silicon is grown in one simultaneous step, as opposed to depositing poly silicon in one step, and introducing a dopant species in a subsequent step. After the P-type poly silicon layer 460 is deposited, the mask layer 450 is removed. A suitable method of removal for this embodiment is chemical-mechanical polishing (CMP).

Figure 4C:
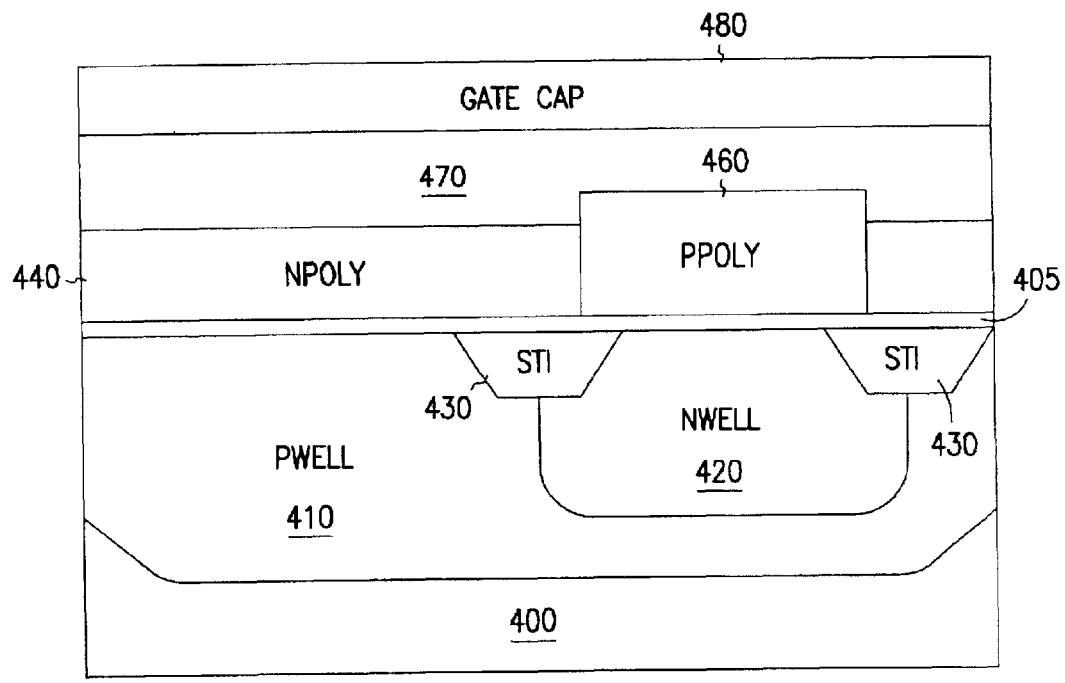

FIG. 4c shows the addition of a strapping layer 470 and a gate cap layer 480 after the masking layer 450 has been removed. The strapping layer 470 is typically a metal layer with a higher conductivity than the poly silicon. Refractory metals such as titanium or tungsten are often used. The strapping layer 470 may also include additional layers to the metal layer that reduce diffusion of metal into the poly silicon. The gate cap 480 is formed from a suitable dielectric layer such as an oxide.

Figure 4D:
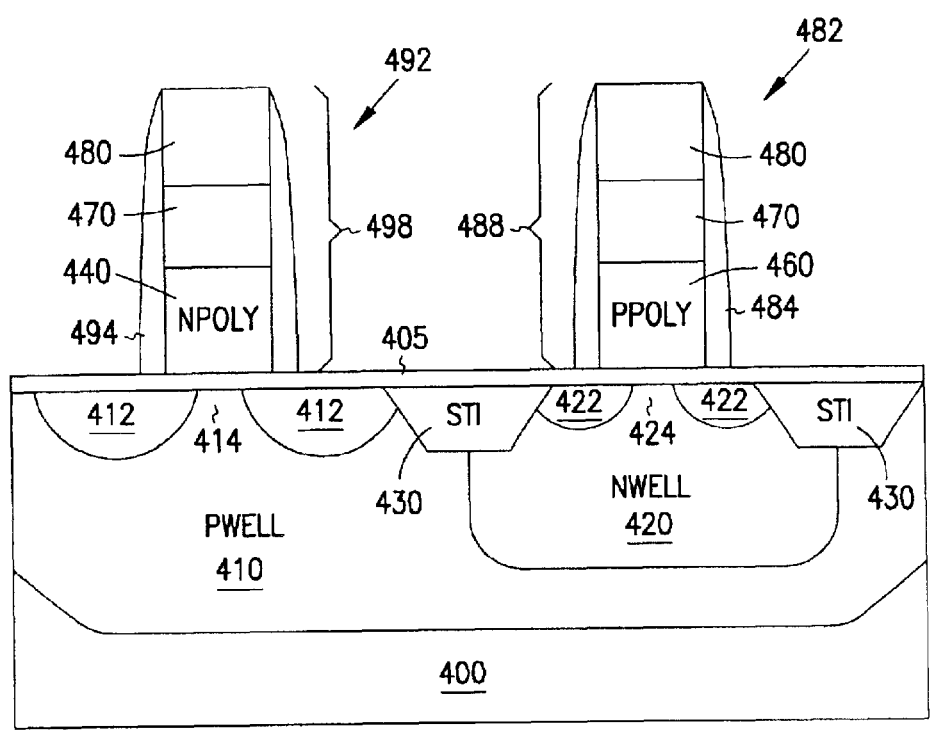

FIG. 4d shows the formation of a surface n-channel transistor 492, and a surface p-channel transistor 482. A gate stack 498 of the n-channel transistor 492 has been masked and etched to form the stack structure as is common in the art. The N-type gate stack 498 is show over an n-channel 414, separated by the first gate dielectric 405. Source and drain regions 412 have been fabricated adjacent to the n-channel to complete the n-channel transistor 492. Likewise, a gate stack 488 of the p-channel transistor 482 has been masked and etched. The P-type gate stack 488 is show over a p-channel 424, separated by the first gate dielectric 405. Source and drain regions 422 have been fabricated adjacent to the n-channel to complete the p-channel transistor 482. As can be seen from the progression from FIGS. 4c to 4d, the gate stacks are made up of the respective layers that were previously deposited, namely the N-type poly silicon layer 440, the P-type poly silicon layer 460, the strapping layer 470 and the gate cap layer 480. After etching to form the gate stacks 498 and 488, the stacks are isolated with dielectric side walls 494 and 484 as is known in the art.

Figure 5A:
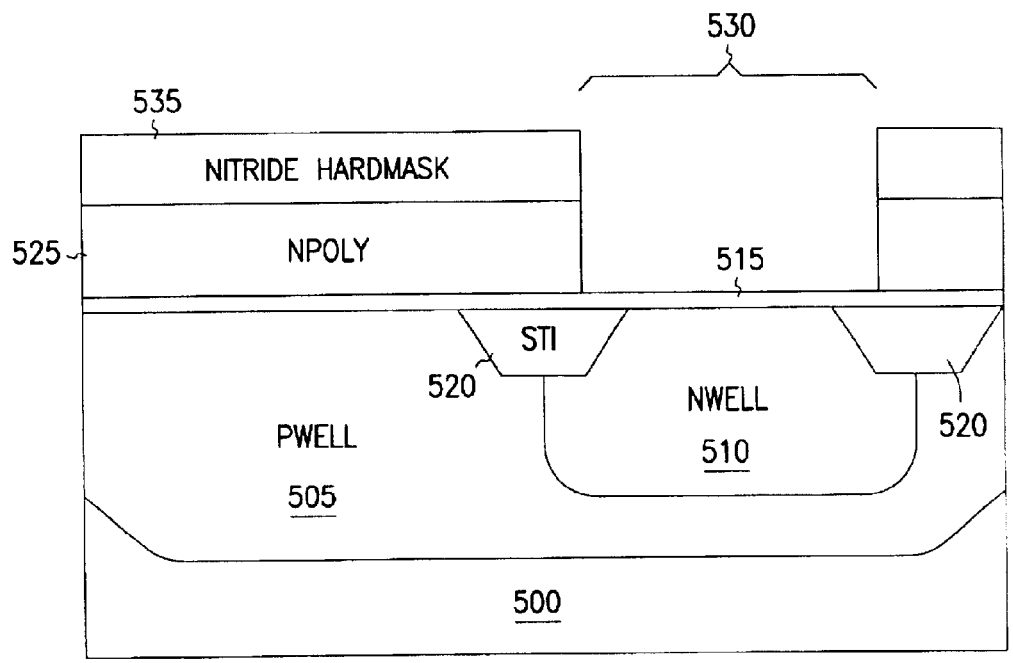
FIGS. 5a–5e show steps in the manufacture of a pair of transistors according to a second embodiment of the present invention.

FIG. 5a describes the first step of a second embodiment of the invention. Again, a semiconductor substrate 500 such as silicon, poly silicon or intrinsic silicon is doped with a P-type dopant to form a P-well 505. Isolation structures 520 are formed within the substrate 500, and may be located within the P-well 505. The isolation structures may be formed before or after the P-well is formed. A first gate dielectric layer 515 that is compatible with an N-poly silicon gate material is grown on top of the substrate. Although this embodiment uses only one layer in the first gate dielectric layer 515, the first gate dielectric may be made up of multiple layers. An N-type poly silicon layer 525 is then deposited on top of the first gate dielectric layer 515. In this embodiment, the N-type poly silicon is deposited in-situ.

After in-situ deposition of the N-type poly silicon layer 525, a masking layer 535 is deposited on top of the N-type poly silicon layer 525. In this embodiment, the masking layer is a nitride hardmask/CMP stop. Other masking layers could be used and not depart from the scope of the invention. A portion of the masking layer 535 is then removed in an N-well region 530 to expose a portion of the N-type semiconductor layer 525. This portion of the N-type semiconductor is removed in the N-well region 530 to expose a portion of the first gate dielectric 515.

An N-well 510 is created within the substrate 500, in the N-well region 530. In this embodiment, the N-well 510 is implanted through the first gate dielectric 515. However, the N-well 510 could be formed by other means than implanting, and it could be formed after removal of the first gate dielectric 515. In this embodiment, the N-well 510 is formed within the P-well 505 that was earlier formed, however, the P-well 505 could be formed elsewhere without departing from the scope of the invention. The isolation structures 430 electrically separate the N-well 510 from the P-well 505.

Figure 5B:
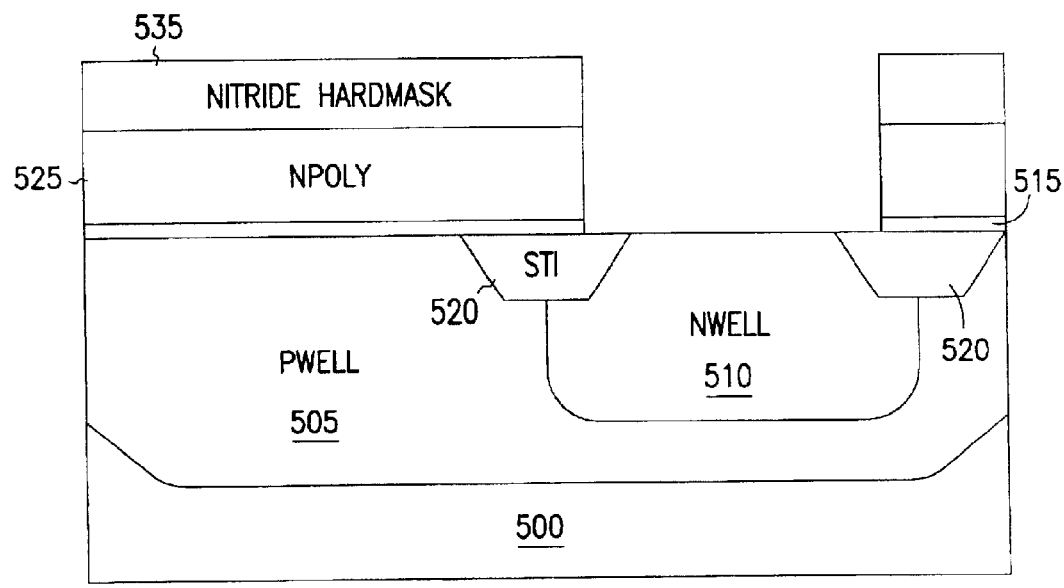
Figure 5C:
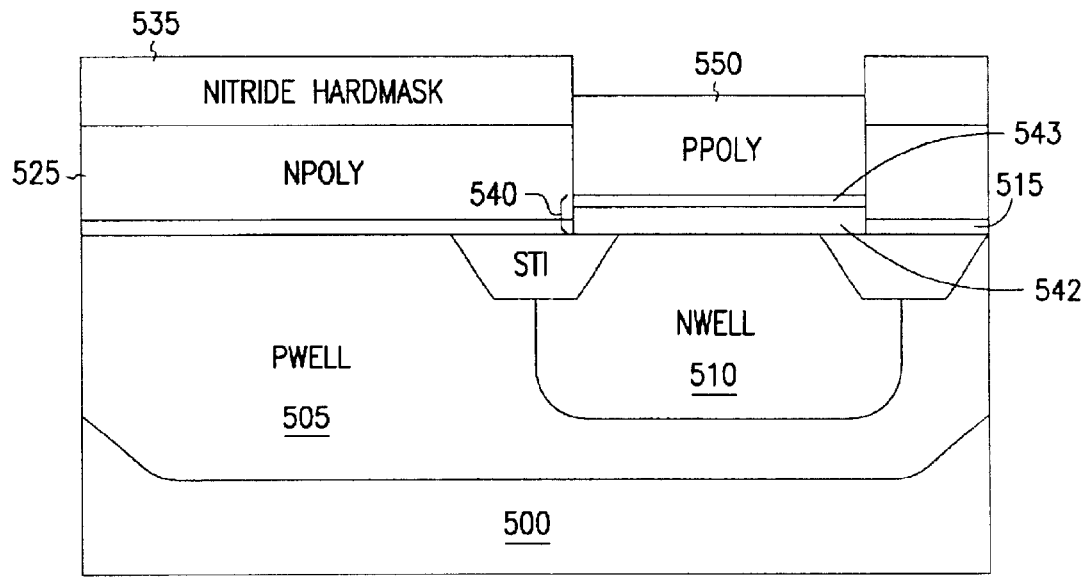

In FIG. 5b, using the same mask layer 535 that was used to create the N-well 510, a portion of the first gate dielectric layer is removed in the n-well region 530 to expose the N-well 510. Again, using the same mask layer saves processing time and materials. Alternatively, the time and processing stations saved can be used to make more advanced semiconductor devices in the same amount of time previously allowed.

A second gate dielectric layer 540 is then grown on the exposed N-well. The second gate dielectric layer 540, like the first gate dielectric layer 515 may be comprised of multiple layers. In this embodiment, the second gate dielectric layer 540 is comprised of two separate layers. One layer is a second dielectric 542 and another layer is a hardened layer 545 that prevents diffusion of the P-type doped poly silicon. The hardened layer may included hard oxides or a nitride coating sufficient to inhibit diffusion of the P-type dopant into the second gate dielectric layer 540.

An advantage of this novel process is the ability to individually tailor the first gate dielectric layer 515 and the second gate dielectric layer 540 for composition, thickness and number of layers. P-type poly silicon has different properties from N-type poly silicon, such as dopant diffusion mobility, which can require different gate dielectric layers to optimize device performance.

In FIG. 5b, again using the same mask layer 535, a P-type poly silicon layer 550 is grown on the second gate dielectric layer 540, within the N-well region 530. The P-type poly silicon layer 550 is grown using in-situ deposition as described above. After the P-type poly silicon layer 550 is deposited, the mask layer 535 is removed. A suitable method of removal for this embodiment is chemical-mechanical polishing (CMP).

Figure 5D:
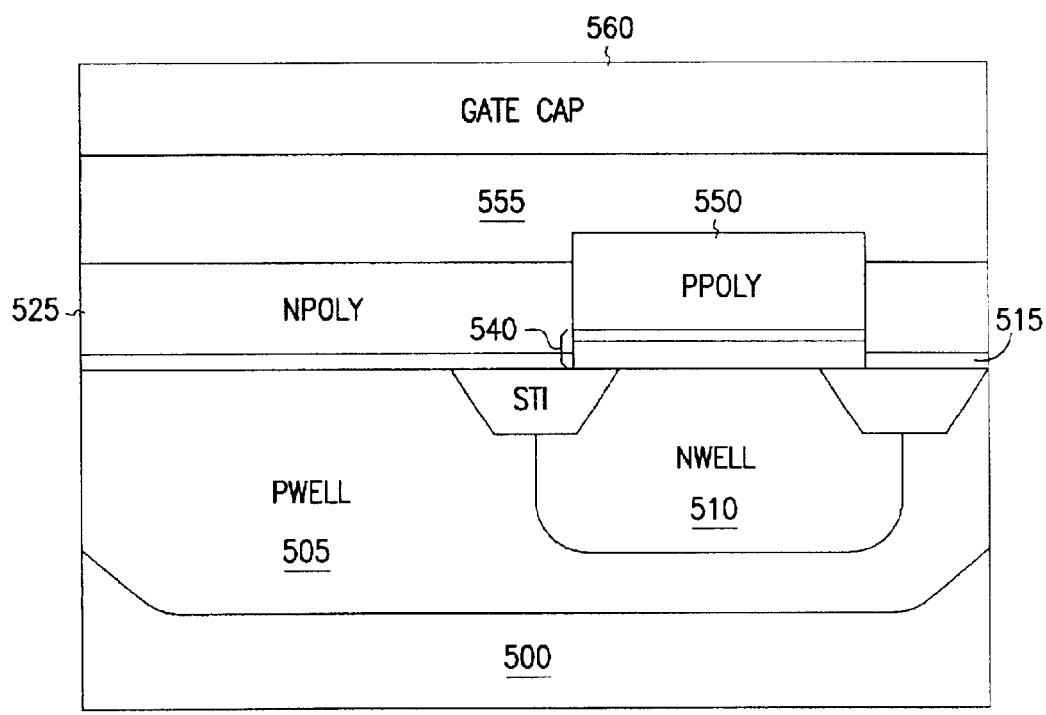

FIG. 5d shows the addition of a strapping layer 555 and a gate cap layer 560 after the masking layer 535 has been removed. The strapping layer 555 is typically a metal layer with a higher conductivity than the poly silicon. Refractory metals such as titanium or tungsten are often used. The strapping layer 555 may also include additional layers to the metal layer that reduce diffusion of metal into the poly silicon. The gate cap 560 is formed from a suitable dielectric layer such as an oxide.

Figure 5E:
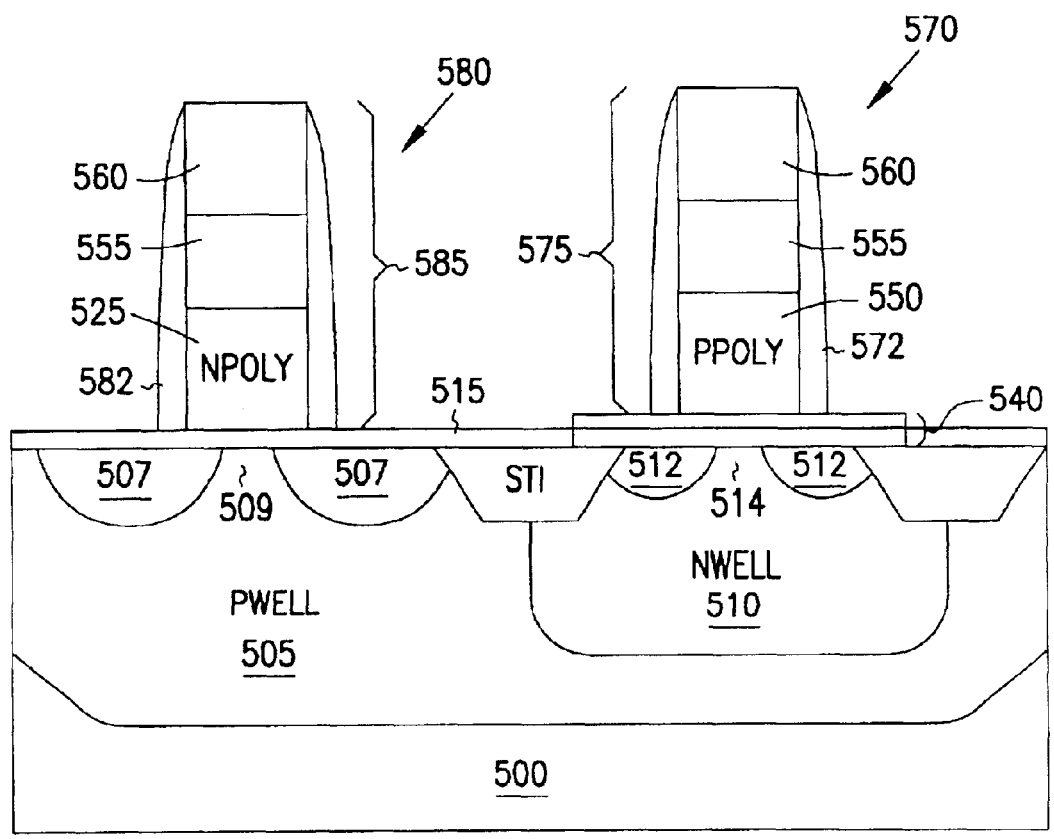

FIG. 5e shows the formation of a surface n-channel transistor 580, and a surface p-channel transistor 570. A gate stack 585 of the n-channel transistor 580 has been masked and etched to form the stack structure as is common in the art. The N-type gate stack 585 is shown over an n-channel 509, separated by the first gate dielectric 515. Source and drain regions 507 have been fabricated adjacent to the n-channel to complete the n-channel transistor 580. Likewise, a gate stack 575 of the p-channel transistor 570 has been masked and etched. The P-type gate stack 575 is shown over a p-channel 514, separated by the second gate dielectric 540. Source and drain regions 512 have been fabricated adjacent to the p-channel to complete the p-channel transistor 570. As can be seen from the progression from FIGS. 5a to 5e, the gate stacks are made up of the respective layers that were previously deposited, namely the N-type poly silicon layer 525, the P-type poly silicon layer 550, the strapping layer 555 and the gate cap layer 560. After etching to form the gate stacks 585 and 575, the stacks are isolated with dielectric side walls 582 and 572 as is known in the art.

One skilled in the art will recognize that a surface n-channel device and a buried n-channel device could be fabricated using the same lithography mask. This provides a manufacturing advantage in that new masks are not needed to implement the method of the invention. This saves in manufacturing costs, and reduces the number of masks that need to be available for fabrication of surface channel devices and buried channel devices.

Conclusion

Thus an improved method of making a semiconductor transistor is shown. The invention contains a method of manufacturing CMOS surface channel transistors using fewer masking steps. In-situ doped poly silicon deposition is used to reduce problems with poly depletion effects. In addition, using this method, the number of layers in each gate dielectric, the dielectric type, and dielectric thickness between n-channel and p-channel devices can be separately controlled. This method also allows the use of a lithography mask normally used to fabricate buried channel devices for use in fabricating surface channel devices, thus saving the manufacture of an additional mask.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a transistor, comprising:
   forming a gate dielectric layer on a semiconductor substrate;
   forming a first conductivity type semiconductor layer on top of the gate dielectric layer;
   selectively removing a portion of the first conductivity type semiconductor layer to expose the gate dielectric, the portion defining a first conductivity type well region;
   forming a first conductivity type semiconductor well in the first conductivity type well region, the first conductivity well region being located over a portion of a single second conductivity type semiconductor well, wherein the second conductivity type semiconductor well is sized to accommodate at least one transistor outside the first conductivity well portion;
   modifying the gate dielectric layer in the first conductivity type well region, the modified gate dielectric being adapted for operation with a second conductivity type gate material;
   depositing a second conductivity type semiconductor material on the modified gate dielectric layer and forming a second conductivity type gate from the second conductivity type semiconductor layer; and
   forming source/drain regions adjacent the gate.

2. The method of claim 1, wherein forming a first conductivity type semiconductor well comprises implanting a first conductivity type well through the gate dielectric layer.

3. The method of claim 1, wherein the first conductivity type semiconductor layer is formed in-situ.

4. The method of claim 1, wherein the second conductivity type semiconductor layer is formed in-situ.

5. The method of claim 1, wherein a single mask is used for selectively removing a portion of the first conductivity type semiconductor layer; forming a first conductivity type semiconductor well; and depositing a second conductivity type semiconductor material on the gate dielectric.

6. A method of forming a transistor, comprising:
   forming a first gate dielectric layer on a semiconductor substrate;
   forming a first conductivity type semiconductor layer on top of the first gate dielectric layer;
   selectively removing a portion of the first conductivity type semiconductor layer to expose the first gate dielectric, the portion defining a first conductivity type well region;
   forming a first conductivity type semiconductor well in the first conductivity type well region, the first conductivity well region being located over a portion of a single second conductivity type semiconductor well, wherein the second conductivity type semiconductor well is sized to accommodate at least one transistor outside the first conductivity well portion;
   removing the first gate dielectric layer in the first conductivity type well region to expose a portion of the first conductivity type semiconductor well;
   forming a second gate dielectric layer over the exposed portion of the first conductivity type semiconductor well, the second gate dielectric layer being adapted for operation with a second conductivity type gate material;
   depositing a second conductivity type semiconductor material on the second gate dielectric layer and forming a second conductivity type gate from the second conductivity type semiconductor layer; and
   forming source/drain regions adjacent the gate.

7. The method of claim 6, wherein forming a first conductivity type semiconductor well comprises implanting a first conductivity type well through the first gate dielectric layer, before removing the first gate dielectric layer.

8. The method of claim 6, further comprising coupling a hardened dielectric layer to the second gate dielectric layer.

9. The method of claim 6, wherein the second gate dielectric layer differs in thickness from the first gate dielectric layer.

10. The method of claim 6, wherein the first conductivity type semiconductor layer is formed in-situ.

11. The method of claim 6, wherein the second conductivity type semiconductor layer is formed in-situ.

12. The method of claim 6, wherein a single mask is used for selectively removing a portion of the first conductivity type semiconductor layer; forming a first conductivity type semiconductor well; removing the first gate dielectric layer; and depositing a second conductivity type semiconductor material on the second gate dielectric layer.

13. A method of forming pair of transistors, comprising:
   forming a second conductivity type semiconductor well in a semiconductor substrate using a single mask;
   forming a gate dielectric layer on the semiconductor substrate;
   forming a first conductivity type semiconductor layer on top of the gate dielectric layer, over the second conductivity type semiconductor well;
   selectively removing a portion of the first conductivity type semiconductor layer to expose the gate dielectric layer, the portion defining a first conductivity type well region;
   forming a first conductivity type semiconductor well in the first conductivity type well region, the first conductivity well region being located over a portion of the second conductivity type semiconductor well;
   modifying the gate dielectric layer in the first conductivity type well region, the modified gate dielectric being adapted for operation with a second conductivity type gate material;

depositing a second conductivity type semiconductor layer on the modified gate dielectric layer;

patterning and forming gates wherein a first gate is formed over the first conductivity type semiconductor well, and a second gate is formed over a remaining portion of the second conductivity type semiconductor well; and forming source/drain regions adjacent the gates.

14. The method of claim 13, wherein forming a second conductivity type semiconductor well comprises implanting a second conductivity type well through the gate dielectric layer.

15. The method of claim 13, wherein the first conductivity type semiconductor layer is formed in-situ.

16. The method of claim 13, wherein the second conductivity type semiconductor layer is formed in-situ.

17. The method of claim 13, wherein a single mask is used for selectively removing a portion of the first conductivity type semiconductor layer; forming a first conductivity type semiconductor well; and depositing a second conductivity type semiconductor layer.

18. A method of forming a pair of transistors, comprising:

forming a second conductivity type semiconductor well in a semiconductor substrate using a single mask;

forming a first gate dielectric layer on the semiconductor substrate;

forming a first conductivity type semiconductor layer on top of the first gate dielectric layer, over the second conductivity type semiconductor well;

selectively removing a portion of the first conductivity type semiconductor layer to expose the first gate dielectric, the portion defining a first conductivity type well region;

forming a first conductivity type semiconductor well in the first conductivity type well region, the first conductivity well region being located over a portion of the second conductivity type semiconductor well;

removing the first gate dielectric layer in the first conductivity type well region to expose a portion of the first conductivity type semiconductor well;

forming a second gate dielectric layer over the exposed portion of the first conductivity type semiconductor well, the second gate dielectric layer being adapted for operation with a second conductivity type gate material;

depositing a second conductivity type semiconductor layer on the second gate dielectric layer;

patterning and forming gates wherein a first gate is formed over the first conductivity type semiconductor well, and a second gate is formed over a remaining portion of the second conductivity type semiconductor well; and forming source/drain regions adjacent the gates.

19. The method of claim 18, wherein forming a first conductivity type semiconductor well comprises implanting a first conductivity type well through the first gate dielectric layer, before removing the first gate dielectric layer.

20. The method of claim 18, further comprising coupling a hardened dielectric layer to the second gate dielectric.

21. The method of claim 18, wherein the second gate dielectric differs in thickness from the first gate dielectric.

22. The method of claim 18, wherein the first conductivity type semiconductor layer is formed in-situ.

23. The method of claim 18, wherein the second conductivity type semiconductor layer is formed in-situ.

24. The method of claim 18, wherein a single mask is used for selectively removing a portion of the first conductivity type semiconductor layer; forming a first conductivity type semiconductor well; removing the first gate dielectric layer; and depositing a second conductivity type semiconductor material on the second gate dielectric layer.

* * * * *

UNITED STATES PATENT AND TRADEMARK OFFICE
CERTIFICATE OF CORRECTION

PATENT NO. : 6,809,014 B2
DATED : October 26, 2004
INVENTOR(S) : Mathew et al.

It is certified that error appears in the above-identified patent and that said Letters Patent is hereby corrected as shown below:

Column 3,
Line 56, delete "horizonal" and insert -- horizontal --, therefor.

Column 4,
Line 10, delete "10" and insert -- 110 --, therefor.

Signed and Sealed this

Twenty-second Day of March, 2005

JON W. DUDAS
*Director of the United States Patent and Trademark Office*